United States Patent
DeBoer et al.

(10) Patent No.: US 6,632,719 B1
(45) Date of Patent: Oct. 14, 2003

(54) CAPACITOR STRUCTURES WITH RECESSED HEMISPHERICAL GRAIN SILICON

(75) Inventors: Scott J. DeBoer; Whonchee Lee, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 09/652,910

(22) Filed: Aug. 31, 2000

Related U.S. Application Data

(62) Division of application No. 09/385,786, filed on Aug. 30, 1999.

(51) Int. Cl.⁷ .............................................. H01L 21/20
(52) U.S. Cl. ....................... 438/381; 458/254; 458/398; 458/753
(58) Field of Search ................. 438/381, 398, 438/254, 255, 748, 753

(56) References Cited

U.S. PATENT DOCUMENTS

| | | | |
|---|---|---|---|
| 4,803,535 A | 2/1989 | Taguchi | |
| 5,270,241 A | 12/1993 | Dennison et al. | |
| 5,283,453 A | 2/1994 | Rajeevakumar | |
| 5,384,152 A | 1/1995 | Chu et al. | |
| 5,392,189 A | 2/1995 | Fazan et al. | |
| 5,407,534 A | 4/1995 | Thakur | |
| 5,418,180 A | 5/1995 | Brown | |
| 5,521,407 A | 5/1996 | Kohyama et al. | |
| 5,555,520 A | 9/1996 | Sudo et al. | |
| 5,753,558 A | 5/1998 | Akram et al. | |
| 5,759,262 A | 6/1998 | Weimer et al. | |
| 5,837,580 A | 11/1998 | Thakur et al. | |
| 5,882,979 A | 3/1999 | Ping et al. | |
| 5,963,804 A | * 10/1999 | Figura et al. | 438/255 |
| 5,963,814 A | 10/1999 | Walker et al. | |
| 6,025,247 A | 2/2000 | Chang et al. | |
| 6,046,083 A | 4/2000 | Lin et al. | |
| 6,090,655 A | * 7/2000 | Zahurak et al. | 438/239 |
| 6,127,239 A | 10/2000 | Jost et al. | |
| 6,159,785 A | 12/2000 | Tsuchimoto et al. | |
| 6,162,679 A | 12/2000 | Lin | |
| 6,177,696 B1 | 1/2001 | Bronner et al. | |
| 6,207,524 B1 | 3/2001 | Gutsche | |
| 6,303,956 B1 | * 10/2001 | Sandhu et al. | 257/306 |
| 6,376,328 B1 | * 4/2002 | Aiso et al. | 438/398 |
| 6,391,712 B2 | * 5/2002 | Ji | 438/253 |
| 6,399,439 B1 | 6/2002 | Yamanishi et al. | |

\* cited by examiner

*Primary Examiner*—Caridad Everhart
(74) *Attorney, Agent, or Firm*—Mueting, Raasch & Gebhardt, P.A.

(57) ABSTRACT

Capacitor structures and capacitors with edge zones that are substantially free of hemispherical grain silicon along the upper edges of the capacitor structures are disclosed. The resulting recessed hemispherical grain silicon layers reduce or prevent separation of particles from the hemispherical grain silicon layer during subsequent manufacturing processes, thereby reducing defects and increasing throughput. Also disclosed are methods of forming the capacitor structures and capacitors in which the silicon layer used to form the hemispherical grain silicon is selectively removed to provide an edge zone that is substantially free of hemispherical grain silicon.

26 Claims, 9 Drawing Sheets a division of application Ser. No. 09/385,786, filed on Aug. 30, 1999, (pending), which is incorporated herein by reference.

CAPACITOR STRUCTURES WITH RECESSED HEMISPHERICAL GRAIN SILICON

This is a division of application Ser. No. 09/385,786, filed on Aug. 30, 1999, (pending), which is incorporated herein by reference.

FIELD OF THE INVENTION

The present invention relates to semiconductor manufacturing. More particularly, the present invention provides capacitor structures including recessed hemispherical grain silicon and methods of forming the same.

BACKGROUND OF THE INVENTION

In the fabrication of integrated circuits, various conductive layers are used. For example, during the formation of semiconductor devices, such as dynamic random access memories (DRAMs), static random access memories (SRAMs), ferroelectric (FE) memories, etc., conductive materials are used in the formation of storage cell capacitors and also may be used in interconnection structures, e.g., conductive layers of contact holes, vias, etc.

As memory devices become more dense, it is necessary to decrease the size of circuit components forming such devices. One way to retain storage capacity of storage cell capacitors of the memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material.

Further, to the increase the capacitance for a storage cell capacitor of a memory device without increasing the occupation area of the storage cell capacitor, various techniques have been used to increase the surface area of the lower electrode of the capacitor. For example, hemispherical grains (HSG) have been used to enhance such surface area of the lower electrode of a capacitor of a memory device.

However, in many cases, the use of HSG to enhance surface area of an electrode can be problematic. The manufacturing of container capacitors, such as is described in U.S. Pat. No. 5,270,241 (Dennison et al.) involves a singulation process whereby the continuous conductive material lining the containers and extending between them on the upper surface of the structure is partially removed to separate the conductive material within a container from the conductive material in the other containers. Singulation may be accomplished using a chemical mechanical polishing (CMP) step which removes only the uppermost horizontal expanses of the continuous conductive layer.

Although CMP is effective at separating the containers, it leaves a structure in which the hemispherical grain silicon precursor layer (i.e., the layer from which the hemispherical grain silicon is formed) and the underlying doped silicon layer both extend to the upper edge of the capacitor plates. As a result, after conversion of the hemispherical grain silicon precursor layer to a layer of hemispherical grain silicon by, e.g., seeding and annealing or any other suitable technique, the hemispherical grain silicon layer typically extends above the outer layer of doped silicon along the edges of the capacitor plates.

Grains or particles from the exposed edge of the hemispherical grain silicon layer are, however, susceptible to separation from the hemispherical grain silicon layer. Once separated or broken off, the loose particles can fall between adjacent capacitors, resulting in electrical shorts between the adjacent capacitors. Such defects adversely affect the output of the manufacturing processes used to form the capacitors. Although typically associated with cup-shaped capacitors, these problems are also experienced in connection with other capacitor structures, e.g., trench, tub, etc.

SUMMARY OF THE INVENTION

The present invention provides capacitor structures with edge zones that are substantially free of hemispherical grain silicon along the upper edges of the capacitor structures. The resulting recessed hemispherical grain silicon layers reduce or prevent separation of particles from the hemispherical grain silicon layer during subsequent manufacturing processes, thereby reducing defects and increasing throughput.

The present invention also includes methods of forming the capacitor structures in which the silicon layer used to form the hemispherical grain silicon is selectively removed to provide an edge zone that is substantially free of hemispherical grain silicon.

In one aspect, the present invention provides a capacitor structure including a cavity having a sidewall structure, an opening, and a bottom opposite the opening; a first layer located on an inner surface of the sidewall structure, wherein the first layer is electrically conductive; a second layer located on the first layer, the second layer comprising hemispherical grain silicon; and an edge zone on the inner surface of the sidewall structure proximate the opening of the cavity, the edge zone extending from the opening of the cavity towards the bottom of the cavity, wherein the edge zone is substantially free of the hemispherical grain silicon.

In another aspect, the present invention provides a capacitor structure including a cavity having a sidewall structure, an opening, and a bottom opposite the opening; a first layer located on an inner surface of the sidewall structure, wherein the first layer is electrically conductive; a second layer located on the first layer, the second layer including hemispherical grain silicon; and an edge zone on the inner surface of the sidewall structure proximate the opening of the cavity, the edge zone extending from the opening of the cavity towards the bottom of the cavity over about 20% or less of the distance between the opening and the bottom of the cavity, wherein the edge zone is substantially free of the hemispherical grain silicon.

In another aspect, the present invention provides a capacitor structure including a cavity having a sidewall structure, an opening, and a bottom opposite the opening; a first layer located on an inner surface of the sidewall structure, wherein the first layer is electrically conductive; a second layer located on the first layer, the second layer including hemispherical grain silicon; and an edge zone on the inner surface of the sidewall structure proximate the opening of the cavity, the edge zone extending from the opening of the cavity towards the bottom of the cavity and having a depth of about 2000 Angstroms or less from the opening of the cavity, wherein the edge zone is substantially free of the hemispherical grain silicon.

In another aspect, the present invention provides a capacitor structure including a cavity having a sidewall structure, an opening, and a bottom opposite the opening; a first layer located on an inner surface of the sidewall structure, wherein the first layer includes doped silicon; a second layer located on the first layer, the second layer including hemispherical grain silicon; and an edge zone on the inner surface of the sidewall structure proximate the opening of the cavity, the edge zone extending from the opening of the cavity towards the bottom of the cavity, wherein the edge zone is substantially free of the hemispherical grain silicon.

In another aspect, the present invention provides a capacitor structure including a cavity having a sidewall structure, an opening, and a bottom opposite the opening; a first layer located on an inner surface of the sidewall structure, wherein the first layer includes doped silicon; a second layer located on the first layer, the second layer including hemispherical grain silicon; and an edge zone on the inner surface of the sidewall structure proximate the opening of the cavity, the edge zone extending from the opening of the cavity towards the bottom of the cavity over about 20% or less of the distance between the opening and the bottom of the cavity, wherein the edge zone is substantially free of the hemispherical grain silicon In another aspect, the present invention provides a capacitor structure including a cavity having a sidewall structure, an opening, and a bottom opposite the opening; a first layer located on an inner surface of the sidewall structure, wherein the first layer includes doped silicon; a second layer located on the first layer, the second layer including hemispherical grain silicon; and an edge zone on the inner surface of the sidewall structure proximate the opening of the cavity, the edge zone extending from the opening of the cavity towards the bottom of the cavity and having a depth of about 2000 Angstroms or less from the opening of the cavity, wherein the edge zone is substantially free of the hemispherical grain silicon.

In another aspect, the present invention provides a method of forming a capacitor structure by providing a cavity in a substrate, the cavity having a sidewall structure, an opening, and a bottom opposite the opening of the cavity; providing a first layer on an inner surface of the sidewall structure, wherein the first layer is electrically conductive; providing a second layer on substantially all of the first layer, the second layer including hemispherical grain silicon precursor; providing fill material in the cavity, wherein at least an edge of the second layer is exposed proximate the opening of the cavity; and removing the hemispherical grain silicon precursor in the second layer proximate the opening of the cavity to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

In another aspect, the present invention provides a method of forming a capacitor structure by providing a cavity in a substrate, the cavity having a sidewall structure, an opening, and a bottom opposite the opening of the cavity; providing a first layer on an inner surface of the sidewall structure, wherein the first layer includes doped silicon; providing a second layer on substantially all of the first layer, the second layer including hemispherical grain silicon precursor; providing fill material in the cavity, wherein at least an edge of the second layer is exposed proximate the opening of the cavity; and removing the hemispherical grain silicon precursor in the second layer proximate the opening of the cavity to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

In another aspect, the present invention provides a method of forming a capacitor structure by providing a cavity in a substrate, the cavity having a sidewall structure, an opening, and a bottom opposite the opening of the cavity; providing a first layer on an inner surface of the sidewall structure, wherein the first layer including doped silicon; providing a second layer on substantially all of the first layer, the second layer including hemispherical grain silicon precursor; providing fill material in the cavity, wherein at least an edge of the second layer is exposed proximate the opening of the cavity; removing the hemispherical grain silicon precursor in the second layer proximate the opening of the cavity by contacting at least the exposed edge of the second layer with an etchant including TMAH at a concentration greater than 2.25% (by weight) to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

In another aspect, the present invention provides a method of forming a capacitor structure by providing a cavity in a substrate, the cavity having a sidewall structure, an opening, and a bottom opposite the opening of the cavity; providing a first layer on an inner surface of the sidewall structure, wherein the first layer includes doped silicon; providing a second layer on substantially all of the first layer, the second layer including hemispherical grain silicon precursor; providing fill material in the cavity, wherein at least an edge of the second layer is exposed proximate the opening of the cavity; removing the hemispherical grain silicon precursor in the second layer proximate the opening of the cavity by contacting at least the exposed edge of the second layer with an etchant including TMAH at a concentration greater than 2.25% (by weight) and less than 3% (by weight) to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

In another aspect, the present invention provides a method of forming a capacitor structure by providing a cavity in a substrate, the cavity having a sidewall structure, an opening, and a bottom opposite the opening of the cavity; providing a first layer on an inner surface of the sidewall structure, wherein the first layer is electrically conductive; providing a second layer on substantially all of the first layer, the second layer including hemispherical grain silicon; providing fill material in the cavity, wherein at least an edge of the second layer is exposed proximate the opening of the cavity; and removing the hemispherical grain silicon in the second layer proximate the opening of the cavity to form an edge zone about the opening of the cavity, the edge zone extending from the opening of the cavity towards the bottom of the cavity, wherein the edge zone is substantially free of the hemispherical grain silicon.

In another aspect, the present invention provides a method of forming a capacitor structure by providing a cavity in a substrate, the cavity including a sidewall structure, an opening, and a bottom opposite the opening of the cavity; providing a first layer on an inner surface of the sidewall structure, wherein the first layer includes doped silicon; providing a second layer on substantially all of the first layer, the second layer including hemispherical grain silicon; providing fill material in the cavity, wherein at least an edge of the second layer is exposed proximate the opening of the cavity; and removing the hemispherical grain silicon in the second layer proximate the opening of the cavity to form an edge zone about the opening of the cavity, the edge zone extending from the opening of the cavity towards the bottom of the cavity, wherein the edge zone is substantially free of the hemispherical grain silicon.

In another aspect, the present invention provides a method of forming a capacitor structure by providing a cavity in a substrate, the cavity having a sidewall structure, an opening, and a bottom opposite the opening of the cavity; providing a first layer on an inner surface of the sidewall structure, wherein the first layer including doped silicon; providing a second layer on substantially all of the first layer, the second layer including hemispherical grain silicon; providing fill material in the cavity, wherein at least an edge of the second layer is exposed proximate the opening of the cavity; removing the hemispherical grain silicon in the second layer proximate the opening of the cavity by contacting at least the exposed edge of the second layer with an etchant including TMAH at a concentration of greater than 2.25% (by weight) to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

In another aspect, the present invention provides a method of forming a capacitor structure by providing a cavity in a substrate, the cavity having a sidewall structure, an opening, and a bottom opposite the opening of the cavity; providing a first layer on an inner surface of the sidewall structure, wherein the first layer includes doped silicon; providing a second layer on substantially all of the first layer, the second layer including hemispherical grain silicon precursor; providing fill material in the cavity, wherein at least an edge of the second layer is exposed proximate the opening of the cavity; removing the hemispherical grain silicon precursor in the second layer proximate the opening of the cavity by contacting at least the exposed edge of the second layer with an etchant including TMAH at a concentration greater than 2.25% (by weight) and less than 3% (by weight) to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

In another aspect, the present invention provides a capacitor including a cavity having a sidewall structure, an opening, and a bottom opposite the opening, the sidewall structure extending between the opening and the bottom of the cavity; a first electrode including an electrically conductive first layer located on an inner surface of the sidewall structure, a second layer including hemispherical grain silicon located on the first layer, and an edge zone on the inner surface of the sidewall structure proximate the opening of the cavity, wherein the edge zone extends from the opening of the cavity towards the bottom of the cavity, and further wherein the edge zone is substantially free of the hemispherical grain silicon; a dielectric layer located on at least a portion of the first electrode; and a second electrode located on the dielectric layer.

These and other features and advantages of the present invention are described below with respect to illustrative embodiments of the apparatus and methods.

DETAILED DESCRIPTION OF ILLUSTRATIVE EMBODIMENTS OF THE INVENTION

Figure 1:
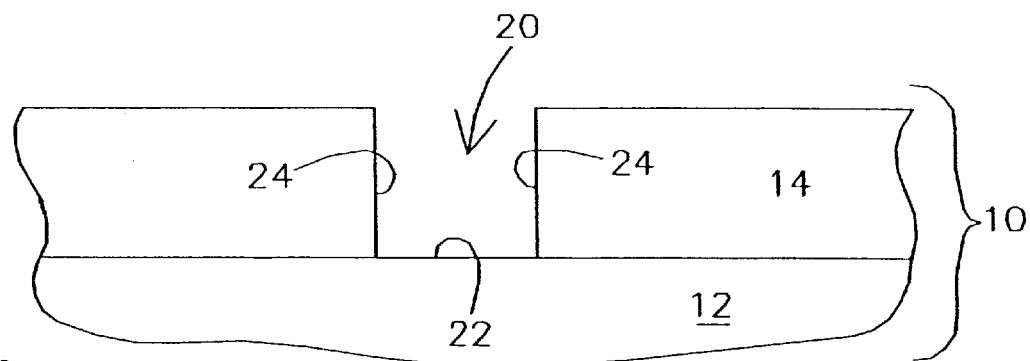
FIG. 1 is a cross-sectional view of an in-process capacitor structure at a stage in the fabrication following formation of a cavity 20.
Figure 2:
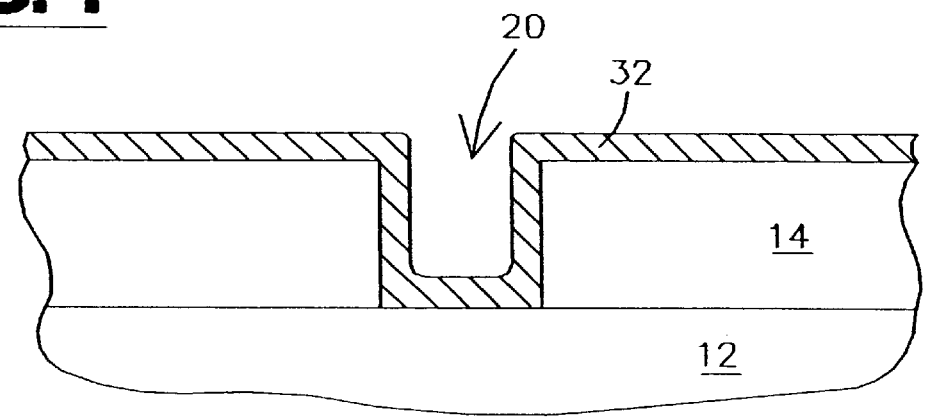
FIG. 2 is a cross-sectional view of the capacitor structure of FIG. 1 following formation of a first layer 32 in the cavity 20.

The present invention is particularly useful for providing the lower electrode of a capacitor structure for a memory device, e.g., a DRAM, an SRAM, an FE memory, etc. However, it should be understood that the methods of providing recessed hemispherical grain silicon layers can be used in any application or structure in which a recessed hemispherical grain silicon layer would be useful.

As used in this application, substrate assembly refers to either a semiconductor substrate such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc. For example, as used herein, substrate assembly may refer to a structure upon which a lower electrode of a capacitor structure is formed.

As used in connection with the present invention, the term "annealing" includes exposing a structure being formed to any combination of temperature and pressure for a predetermined time that will affect the physical properties of the referenced layer or material. Annealing may be performed in a gas atmosphere and with or without plasma enhancement.

Although only one capacitor structure is illustrated in the drawings and discussed below, it will be understood that the capacitor may, and typically are, fabricated in arrays. In other words, a plurality of capacitor structures are manufactured simultaneously on substrate assemblies using the methods of the present invention.

Figure 6:
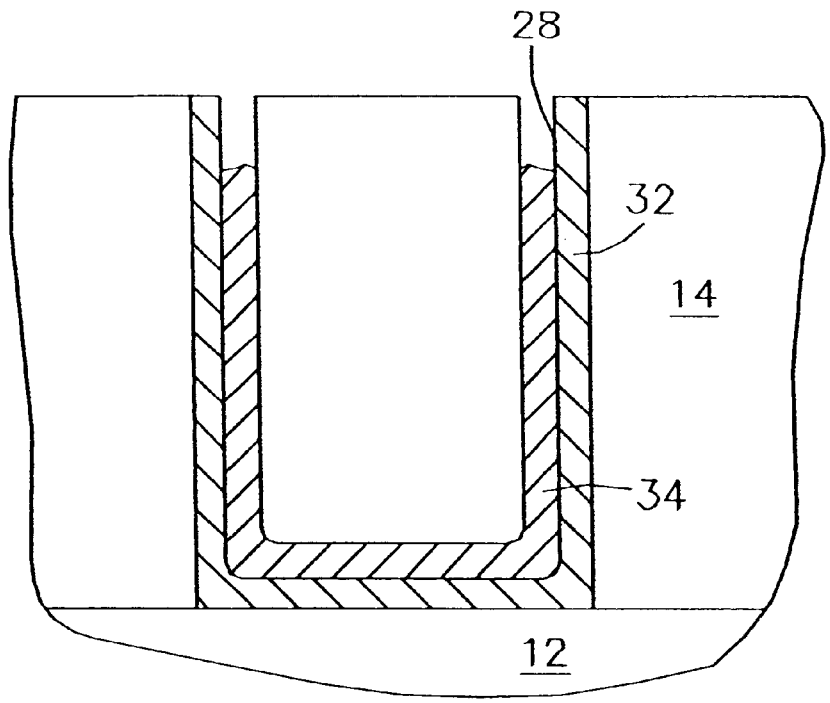
FIG. 6 is a cross-sectional view of the capacitor structure of FIG. 5 following removal of a portion of the second layer 34.
Figure 7:
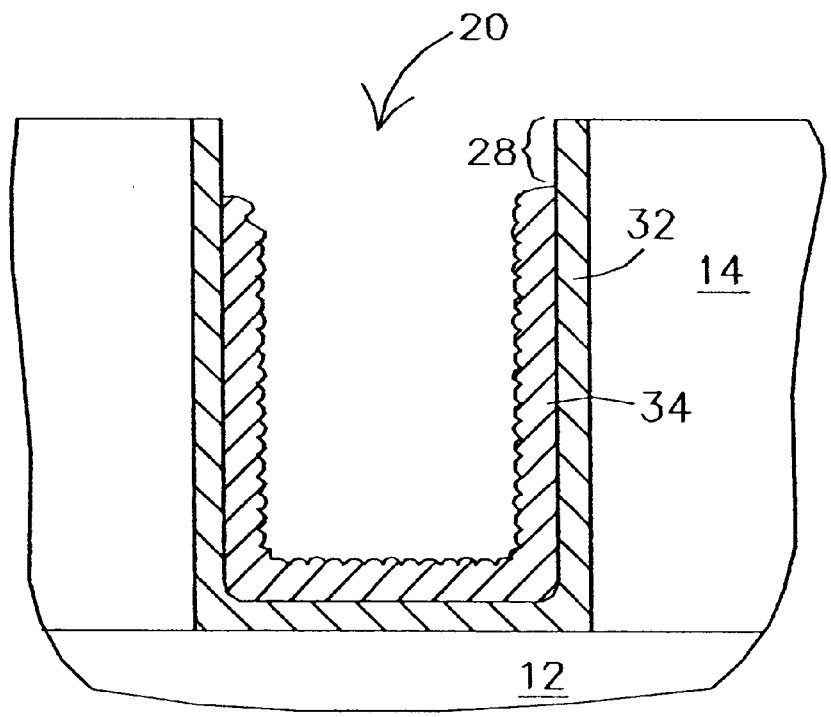
FIG. 7 is a cross-sectional view of the capacitor structure of FIG. 6 following removal of the fill material and formation of hemispherical grain silicon from the second layer 34.
Figure 8:
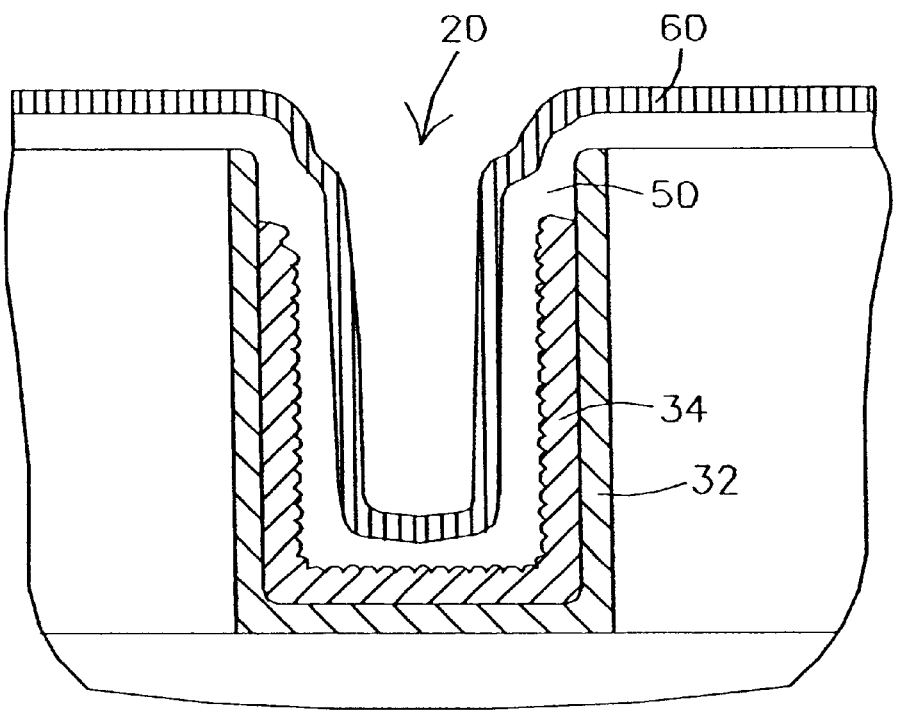
FIG. 8 is a cross-sectional view of the capacitor structure of FIG. 6 following formation of a dielectric layer 50 and a second electrode layer 60.

FIGS. 1–8 illustrate a method of forming a lower electrode for a container structure according to one method of the present invention. The lower electrode of capacitor structure shown in FIG. 8 is formed using a rough conductive layer of hemispherical grain silicon according to the present invention.

FIG. 1 illustrates a substrate assembly 10 including a first substrate portion 12 and a second substrate portion 14. Substrate portion 14 is formed on substrate portion 12 and includes a cavity 20 defined therein by a bottom surface 22 on the first substrate portion 12 and one or more side walls 24 of second substrate portion 14. The first substrate portion 12 may include a region (not shown) to which a lower electrode of capacitor structure (see FIG. 8) can be electrically connected.

The second portion 14 of the substrate assembly 10 is preferably an insulative layer such as an oxide layer, e.g., silicon dioxide, BPSG, PSG, etc. In one embodiment of the invention, the second substrate portion 14 is a layer of BPSG, although other materials that allow for proper cavity formation may be used for the substrate assembly 10. Also, although each portion of the substrate assembly 10 is depicted as a homogenous, single layer, each portion of the substrate assembly 10 may be provided as a non-homogeneous layer and/or multiple layers of the same or different materials.

Cavity 20 is defined in substrate assembly 10 by bottom surface 22 and the one or more side walls 24. It is preferred, but not required, that the bottom surface 22 of the cavity 20 be formed by an exposed portion of the first substrate portion 12 and that the sidewall or sidewalls 24 of the cavity are formed by the second substrate portion 14. Furthermore, it is preferred that the sidewalls 24 are substantially vertical where the upper surface 16 of the second substrate portion 14 defines a horizontal plane. By "substantially vertical" it is meant that the sidewalls 24 form an angle of 90 degrees plus or minus several degrees with the upper surface 16 of the second substrate portion 14. When the terms "vertical" or "normal" are used in this disclosure, exact verticality is not required, as perfect geometric relationships exist only in theory.

The cavity 20 may have any desired shape that is conducive to use as a capacitor. In some instances, the cavity 20 may be generally cylindrical and in other cases the cavity 20 may be elongated along one axis to form a tub-shaped or trench capacitor structure. Also, although the capacitor structures are described herein in the context of container capacitors (i.e., those fabricated at least partly above the level of the access transistor gates), the present invention may also be applied to the formation of capacitors in a substrate. In other variations, the methods of providing recessed hemispherical grain silicon layers described herein may be used for one or more numerous applications, e.g., interconnection applications, capacitor applications, etc.

The present invention is useful when forming recessed hemispherical grain silicon layers in small high aspect ratio openings. As described herein, small high aspect ratio openings have feature sizes or critical dimensions below about 1 micron (e.g., such as a diameter or width of an opening being less than about 1 micron), and aspect ratios greater than about 1. Such aspect ratios are applicable to contact holes, vias, trenches, and any other configured openings, such as container or trench openings for formation of capacitor structures. For example, a trench having an opening of 1 micron and a depth of 3 microns has an aspect ratio of 3.

The capacitor structure of FIG. 8 is formed with a rough hemispherical grain lower electrode as illustrated in FIGS. 1–8 by providing a first layer 32 in the cavity 20 and on surfaces such as upper surface 16 of second substrate portion 14. The first layer 32 and the other layers described herein may typically be deposited using CVD processes such that conformal coverage or step coverage within the cavity 20 and at various other portions of the structure, such as corners 26, are conformally covered with the material being deposited.

The first layer 32 is preferably electrically conductive because it will form a portion of one electrode in a capacitor as described below. In one embodiment of the invention, the first layer 32 is formed using doped silicon, more preferably the first layer 32 consists essentially of doped silicon. The doped silicon used for the first layer 32 may be either doped amorphous silicon or doped polysilicon. The first layer 32 preferably covers the upper surface 16 of the second substrate portion 14 and conformally lines the walls bottom 22 and sidewalls 24 of cavity 20. It will also be noted that, where the cavity 20 is cup-shaped, the first layer 32 preferably conformally forms a cup-shaped structure within the cavity 20.

Figure 3:
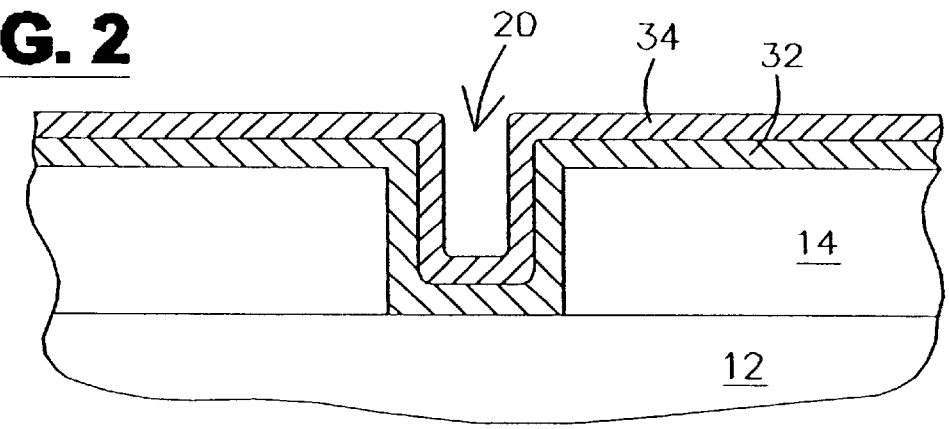
FIG. 3 is a cross-sectional view of the capacitor structure of FIG. 2 following formation of a second layer 34 on the first layer 32.

Referring to FIG. 3, a second layer 34 is then formed on the first layer 32 via any suitable technique. The second layer 34 preferably conformally covers the first layer 32 both inside and outside the cavity 20.

The second layer 34 may alternately be referred to a hemispherical grain silicon precursor layer because it should be formed of materials that are amenable to the formation of hemispherical grain silicon. As a result, the second layer 34 includes some silicon in its composition. In one embodiment of the invention, the second layer 34 is formed of undoped amorphous silicon, more preferably the second layer 34 consists essentially of undoped amorphous silicon.

Regardless of the exact choice of materials for the second layer 34, it should be selectively removable as compared to the first layer 32. For example, one preferred combination of materials for the first layer 32 and the second layer 34 is doped polysilicon for the first layer 32 and undoped amorphous silicon for the second layer 34. Both layers 32 and 34 may preferably consist essentially of these materials. Although it is preferred that the second layer 34 is substantially undoped when the first layer 32 is doped silicon, it may be possible that the second layer 34 includes a dopant provided that the dopant concentration in the second layer 34 does not prevent hemispherical grain silicon formation in that layer (as discussed below) and that selective removal of the second layer 34 relative to the first layer 32 is also not substantially affected.

Figure 4:
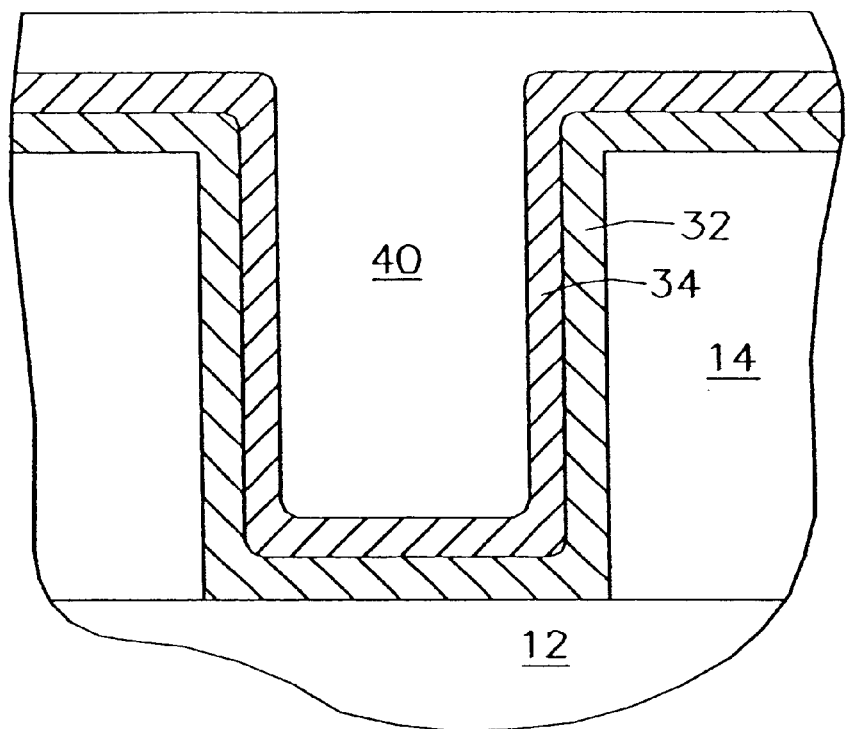
FIG. 4 is a cross-sectional view of the capacitor structure of FIG. 3 following formation of a layer of fill material 40 in the cavity 20.

After the first layer 32 and the second layer 34 are deposited, the cavity 20 is filled with a suitable fill material 40 as illustrated in FIG. 4. Typically, the fill material 40 will be provided in the form of a planarizing layer, i.e., a layer applied in sufficient amounts to fill the cavities 20 and provide a generally continuous layer of the fill material on the upper surfaces of the structure between the cavities 20. Examples of suitable fill materials 40 include, but are not limited to: photoresists; spin-on-glass (SOG); and low temperature deposited (e.g., less than 500° C.) silicon oxide, silicon oxynitride, or silicon nitride. Regardless of the exact material used, the fill material 40 should exhibit a relatively low etch rate relative to the second layer 34 or at least an etch rate that is not substantially greater than the etch rate of the second layer 34.

Figure 5:
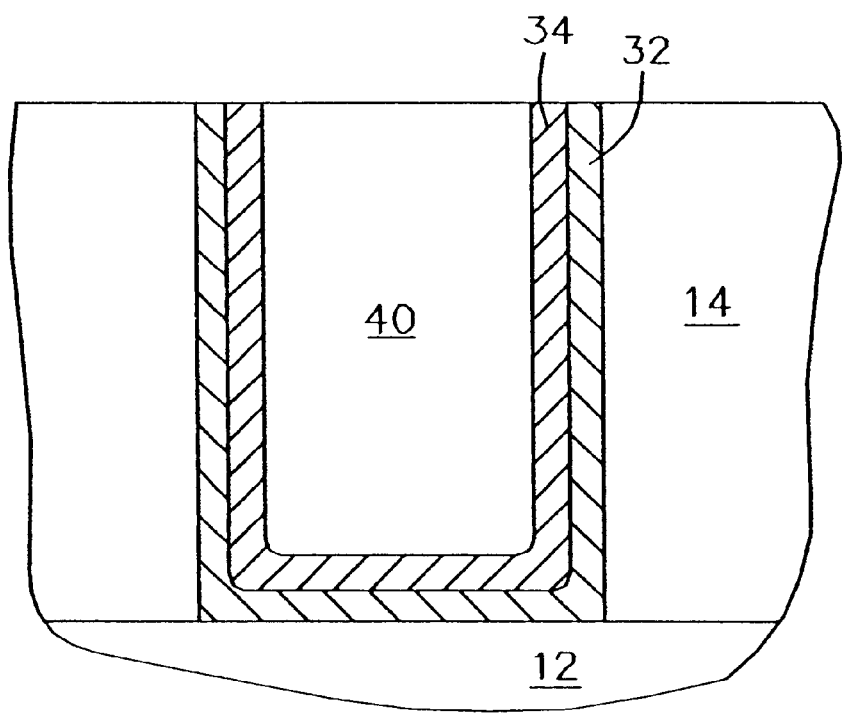
FIG. 5 is a cross-sectional view of the capacitor structure of FIG. 4 following planarization to remove the fill material 40 outside of the cavity 20.

After the fill material 40 is applied to the structure, the portions of the first layer 32, the second layer 34 and the fill material 40 outside of the cavity 20 are removed as illustrated in FIG. 5. As a result, the first layer 32, second layer 34 and fill material 40 within each cavity 20 are separated from the corresponding layers in other cavities 20. Removal of the exposed portions of the first layer 32, second layer 34 and fill material 40 can be performed by any suitable technique. For example, a chemical-mechanical polishing (CMP) technique may be practiced on the array to remove the exposed portions of the first layer 32, second layer 34 and fill material 40, i.e., those portions outside of the cavity 20.

After removal of the first layer 32, second layer 34 and the fill material 40 (if any) from the areas outside of the cavity 20, an edge 33 of the first layer 32 and an edge 35 of the second layer 34 are exposed about the upper perimeter of the cavity 20 as illustrated in FIG. 5. A suitable selective removal process is then performed to remove a portion of the second layer 34 along its exposed edge 35. The removal techniques used selectively remove the second layer 34 over the first layer 32, with a preferred selectivity of at least about 2:1 or greater.

Where the first layer 32 is doped polysilicon and the second layer 34 is undoped amorphous silicon, one suitable selective removal process may be an etching process with a preferred selectivity for the second layer 34 over the first layer 32 and the fill material 40 of at least about 2:1 or greater. More preferably, the selectivity of the etching process is at least about 4:1 or greater.

Where the first layer 32 is doped polysilicon, the second layer 34 is undoped amorphous silicon, one suitable etching process involves the use of a TMAH (tetramethyl ammonium hydroxide) wet etch process in which the TMAH is held at a concentration greater than 2.25% (by weight) at a temperature of about 30° C., more preferably the concentration of the TMAH is about 2.5% or greater at a temperature of about 30° C., and still more preferably, the TMAH concentration is about 2.6% at a temperature of about 30° C. It may also be preferred that the concentration of TMAH in the etch solution be about 3% (by weight) or less when the etchant is at a temperature of about 30° C.

The capacitor structures are preferably immersed in the TMAH solution for a period sufficient to remove the second layer 34 a sufficient amount relative to the first layer 32. With the preferred combination of undoped amorphous silicon, doped polysilicon and photoresist, immersion for about 5 minutes or less, more preferably about 1 minute is typically sufficient to provide the desired edge zone depth as described below.

Furthermore, where a TMAH wet etch process is used to selectively remove an undoped amorphous silicon layer 34 over a doped polysilicon first layer 32, it is preferred that the doped polysilicon in the first layer 32 is not annealed after deposition to maintain desire selectivity in the removal of the preferred doped amorphous silicon in the second layer 34.

Other selective removal techniques for selectively removing the second layer 34 relative to the first layer 32, including other etching processes, will be known to those skilled in the art and may be substituted for those specifically recited herein.

As illustrated in FIG. 6, the preferred selective removal process leaves the second substrate portion 14 and the fill material 40 in the cavity 20 substantially unaffected. It may, however, also be possible to remove a portion of the second layer 34 and the fill material 40 either together in a removal process that is selective to the second layer 34 and the fill material 40 over the first layer 32. Alternatively, it may be possible to selectively remove a portion of the fill material 40 within the cavity 20 to a desired depth, followed by selective removal of the second layer 34 over the first layer 32. At the completion of the selective removal process (regardless of which form it takes), an edge zone 28 is created about the upper portion of the sidewall or sidewalls 24 of the cavity 20 that is substantially free of second layer 34.

The depth of the edge zone 28 can be measured by a number of techniques. For example, the edge zone depth may be determined based on a percentage of the depth of the cavity 20 itself. When so measured, the depth of the cavity 20 is determined before the first layer 32 and the second layer 34 are deposited and is measured along a vertical axis from the upper surface 16 of the second substrate portion 14 to the bottom 22 of the cavity 20. When measured as a percentage of cavity depth, it may be preferred that the depth of the edge zone 28 be about 20% or less of the cavity depth, more preferably about 10% or less, and even more preferably about 5% or less. It is further preferred that the edge zone 28 have some depth, i.e., that the depth of the edge zone 28 is greater than 0%.

The depth of the edge zone 28 may alternatively be measured in terms of distance from the upper surface 16 of the second substrate portion 14 to the bottom of the edge zone 28 along a substantially vertical axis after processing to reach the structure depicted in FIG. 6. When so measured, it may be preferred that the edge zone depth be about 2000 Angstroms or less, more preferably about 1000 Angstroms or less, and even more preferably about 500 Angstroms or less. It is further preferred that the edge zone 28 have some depth, i.e., that the depth of the edge zone 28 is greater than zero.

Following the selective removal of a portion of the second layer 34, the fill material within the cavity 20 is removed by any suitable technique. Suitable techniques for removal of the fill material 40 are those that leave the remainder of the structure substantially unaffected. If the fill material 40 is a photoresist, it is preferably chemically stripped from the cavity 20.

After removal of the fill material from the cavity 20, the second layer 34 is converted to hemispherical grain silicon via any suitable technique. The resulting structure is illustrated in FIG. 7. Because an edge zone 28 that is substantially free of the second layer 34 was created about the upper portions of the sidewall or sidewalls 24 of the cavity 20, that edge zone 28 is also substantially free of any hemispherical grain silicon. With the hemispherical grain silicon recessed within the cavity 20, subsequent processing steps are unlikely to dislodge grains of HSG silicon that could fall outside of the cavity 20 and short adjacent capacitor structures or cause other defects.

Formation of hemispherical grain silicon from second layer 34 may take place via any suitable technique. For example, the second layer 34 may be seeded and annealed under conditions suitable to the formation of hemispherical grain silicon. A variety of techniques useful in the formation of hemispherical grain silicon may be used. Examples include, but are not limited to those described in U.S. Pat. Nos. 5,407,534; 5,418,180; 5,837,580; 5,759,262; and 5,882,979. The first layer 32 is preferably not converted to hemispherical grain silicon. If, for example, the first layer 32 is doped amorphous silicon, it may not convert to hemispherical grain silicon under the same conditions as will the substantially undoped amorphous silicon preferably used for second layer 34.

As a result of the hemispherical grain silicon formation process, some diffusion of the dopant from the preferred doped polysilicon of the first layer 32 into the hemispherical grain silicon of the second layer 34 may be experienced, although such diffusion is typically limited.

The result of the hemispherical grain silicon formation from second layer 34 is a first electrode as illustrated in FIG. 7, where the first electrode is the combination of first layer 32 and hemispherical grain silicon in the second layer 34. After completion of the first electrode and cavity structure as depicted in FIG. 7, a dielectric layer 50 can be provided within the cavity 20. Although not shown, at least some of the second substrate portion 14 outside of the first layer 32 may also be removed to allow the outside surface of the first layer 32 to further contribute to overall capacitance.

The dielectric layer 50 may be any suitable material having a suitable dielectric constant. Preferably, a suitable dielectric constant is a high dielectric constant material such as those materials having a dielectric constant of greater than about 25. Suitable dielectric constant materials for forming dielectric layer 50 may include, but are not limited to: silicon nitride, silicon oxynitride, tantalum pentoxide ($Ta_2O_5$), $Ba_xSr_{(1-x)}TiO_3$[BST], $BaTiO_3$, $SrTiO_3$, $PbTiO_3$, $Pb(Zr,Ti)O_3$[PZT], $(Pb,La)(Zr,Ti)O_3$[PLZT], $(Pb,La)TiO_3$[PLT], $KNO_3$, $LiNbO_3$, and combinations of any two or more of these materials.

Further, after formation of the dielectric layer 50, a second electrode 60 can be formed on the dielectric material 50 opposite from the first electrode (layers 32 and 34). The second electrode 60 may be formed of any suitably conductive material. Examples include, but are not limited to: doped polysilicon, tungsten nitride, titanium nitride, tantalum nitride, platinum metals and alloys thereof, ruthenium, and ruthenium oxide. The dielectric layer 50, second electrode layer 60 can then be selectively removed from outside of the cavity 20 to form the desired capacitor structure. Such a structure may or may not include removal of all or a portion of the second substrate portion 14.

Figure 9:
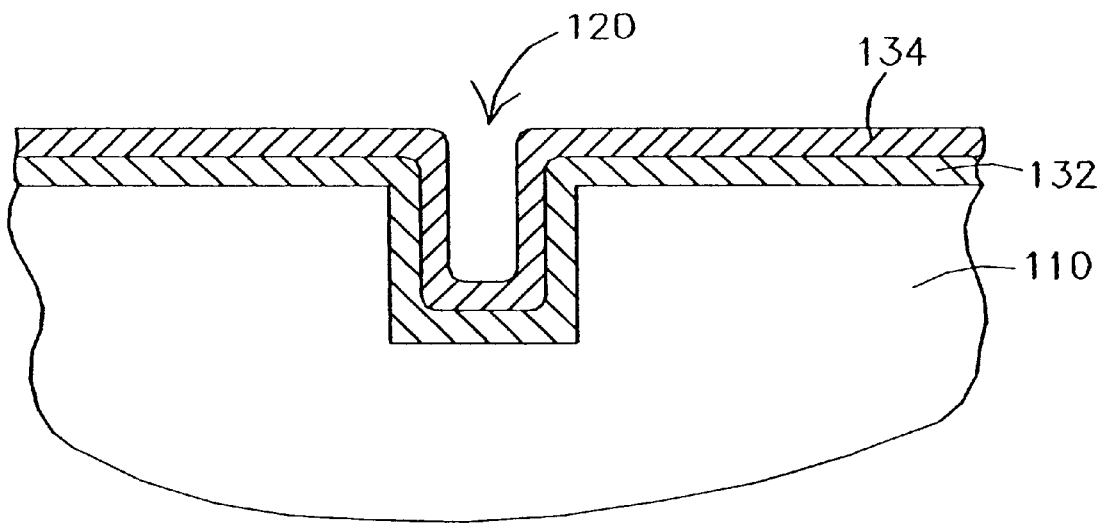
FIG. 9 is a cross-sectional view of an alternative capacitor structure including a hemispherical grain silicon on a first layer 132 in a cavity 120.
Figure 10:
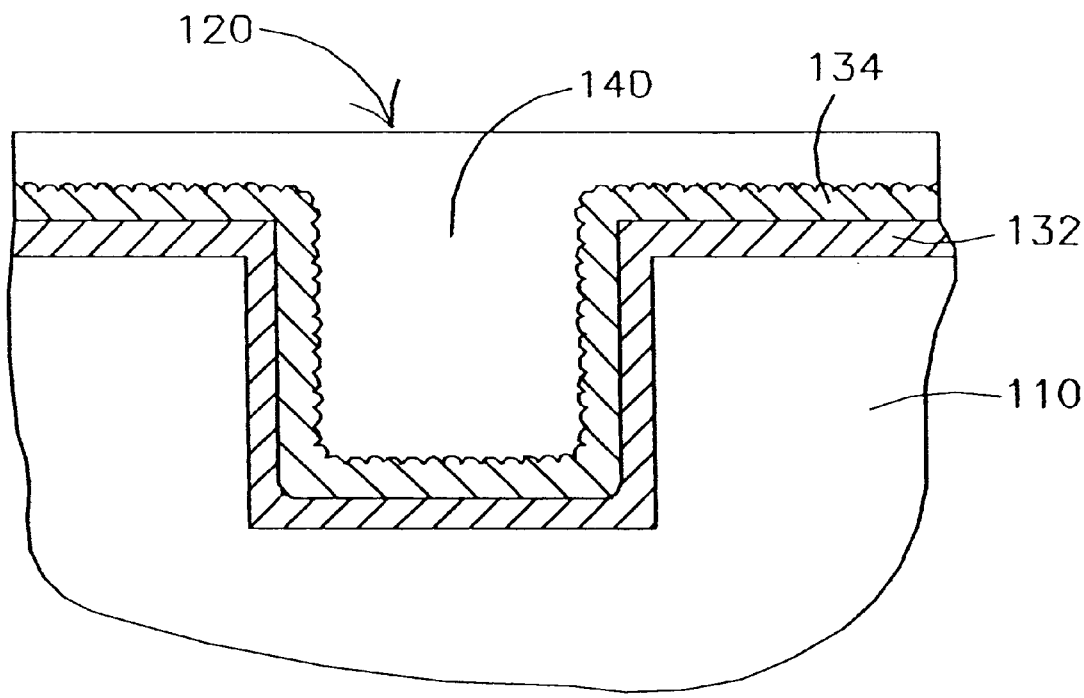
FIG. 10 is a cross-sectional view of the capacitor structure of FIG. 9 following formation of a layer of fill material 140 in the cavity 120.
Figure 11:
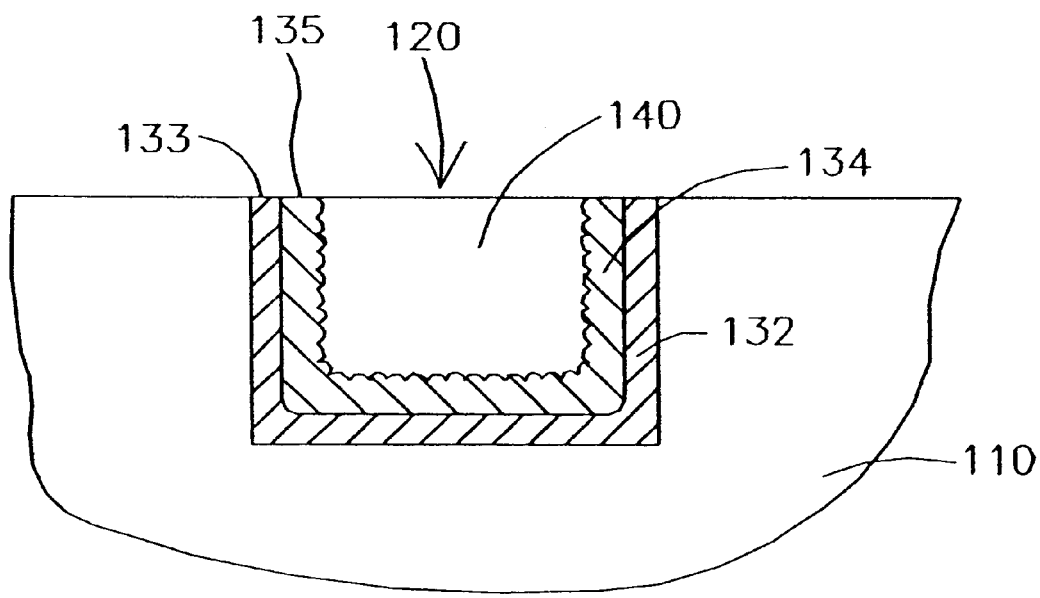
FIG. 11 is a cross-sectional view of the capacitor structure of FIG. 10 following planarization to remove the fill material 140 and hemispherical grain silicon outside of the cavity 20.

FIGS. 9–11 illustrate another method of providing a capacitor structure with recessed HSG silicon according to the present invention. This method begins with a structure similar to that of FIG. 3 which, in FIG. 9, includes a cavity 120 formed in a substrate assembly 110. The cavity 120 is lined with a first layer 132 of doped silicon (polysilicon or amorphous) on which a second layer 134 of hemispherical grain silicon precursor is deposited.

The hemispherical grain silicon precursor in the second layer 134 is converted to hemispherical grain silicon before the fill material 140 is deposited therein as illustrated in FIG. 10. The conversion into hemispherical grain silicon can be by any suitable technique as discussed above with respect to layer 34. After conversion, the fill material 140 will typically be provided in the form of a planarizing layer, i.e., a layer applied in sufficient amounts to fill the cavity 120 and provide a generally continuous layer of the fill material on the upper surfaces of the structure between adjacent cavities. Examples of suitable fill materials 140 are discussed above.

After the fill material 140 is applied to the structure, the portions of the first layer 132, the second layer 134 (now hemispherical grain silicon) and the fill material 140 outside of the cavity 120 are removed as illustrated in FIG. 11. As a result, the first layer 132, second layer 134 and fill material 140 within each cavity 120 are separated from the corresponding layers in other cavities. Removal of the exposed portions of the first layer 132, second layer 134 and fill material 140 can be performed by any suitable technique as discussed above.

After removal of the first layer 132, second layer 134 and the fill material 140 (if any) from the areas outside of the cavity 120, an edge 133 of the first layer 132 and an edge 135 of the second layer 134 are exposed about the upper perimeter of the cavity 120 as illustrated in FIG. 11. A suitable selective removal process is then performed to remove a portion of the hemispherical grain silicon in the second layer 134 along its exposed edge 135 in the manners and techniques described above with respect to second layer 34.

A more specific illustration of using the above-described processes is described below with reference to FIG. 12 wherein a rough conductive first electrode 230 is formed according to one of the processes described herein for a high dielectric capacitor of a storage cell. There are other semiconductor processes and structures for various devices, e.g., CMOS devices, memory devices, etc., that would benefit from the present invention and in no manner is the present invention limited to the illustrative embodiments described herein, e.g., an electrode structure.

Figure 12:
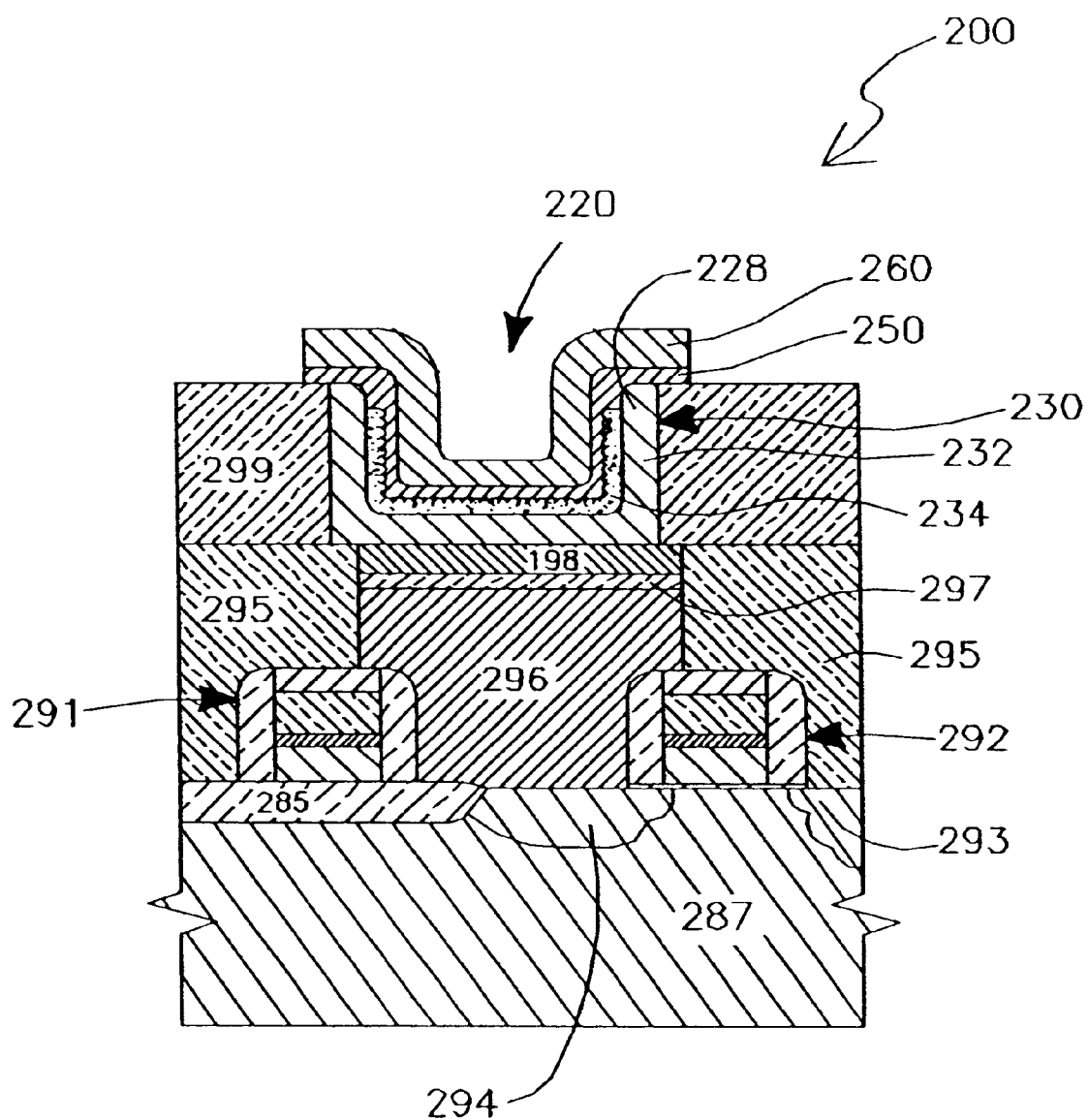
FIG. 12 is an illustrative diagram of a container capacitor structure using a recessed hemispherical grain electrode formed according to the present invention in a storage cell capacitor application.

As shown in FIG. 12, a device structure 200 is fabricated in accordance with conventional processing techniques through the formation of a cavity 220. Such processing is performed prior to depositing a first electrode structure 230 on the surfaces defining the cavity 220 using the methods in accordance with the present invention. The first electrode 230 is formed according to the methods described above and, as such, includes a conductive layer 232 and a recessed hemispherical grain silicon layer 234 including an edge zone 228.

As described in U.S. Pat. No. 5,392,189 to Fazan et al., entitled "Capacitor Compatible with High Dielectric Constant Materials Having Two Independent Insulative Layers and the Method for Forming Same," issued Feb. 21, 1995, the device structure 200 includes field oxide regions 285 and active regions, i.e., those regions of the substrate 287 not covered by field oxide. A word line 291 and a field effect transistor (FET) 292 are formed relative to the field oxide 285. Suitable source/drain regions 293, 294 are created in silicon substrate 287. An insulative conformal layer of oxide material 295 is formed over regions of FET 292 and word line 291. A polysilicon plug 296 is formed to provide electrical communication between substrate 287 and a storage cell capacitor to be formed thereover. Various barrier layers are formed over the polysilicon plug 296, such as, for example, layers 297 and 298. For example, such layers may be titanium nitride, tungsten nitride, or any other metal nitride which acts as a barrier. Thereafter, another insulative layer 299 is formed and the opening 220 is defined therein.

The device structure 200 includes a dielectric layer 250 formed of material such as described above is then formed relative to the first electrode 230. Following formation of the layer of dielectric material, a second electrode 260 is formed relative to the dielectric layer 250, such that the first electrode 230, dielectric layer 250 and second electrode 260 form a capacitor as a part of device structure 200.

EXAMPLES

The following non-limiting examples were performed to illustrate the present invention.

Example 1

A structure similar to that illustrated in FIG. 9 was provided. The upper portion of a substrate assembly 110 was formed of BPSG. A cavity 120 with an aspect ratio of about 7:1 (depth:width) was formed in the BPSG and lined with a first layer 132 of doped polysilicon (phosphorus dopant at a concentration of $10^{20}/cm^3$) by low pressure CVD to a thickness of about 500 Angstroms.

A layer of undoped amorphous silicon was provided as layer 134 by CVD to a thickness of about 500 Angstroms and converted to HSG silicon by seeding and annealing. Fill material 140 in the form of a photoresist was provided in the remainder of the cavity 120, with the resulting structure illustrated in FIG. 10.

Following application of the photoresist, the next step was to employ a chemical-mechanical polishing (CMP) process to isolate the cavities 120, followed by decapping of the polysilicon in layer 132 in an etch solution of hydrofluoric acid (HF) and TMAH. In other words, the structure was planarized down to the level of the BPSG and the native oxide is removed from the exposed doped silicon in layer 132 and undoped HSG silicon in layer 134. The resulting structure is illustrated in FIG. 11.

With edges of both the doped silicon layer 132 and the undoped HSG silicon layer 134 exposed at the top of the cavity (the remainder of which is filled with photoresist 140), the structure was subjected to a wet etch of 2% TMAH (by weight) at 30 degrees Celsius for a period of 5 minutes.

After etching, the photoresist 140 is removed from the cavity 120 by stripping.

Figure 13:
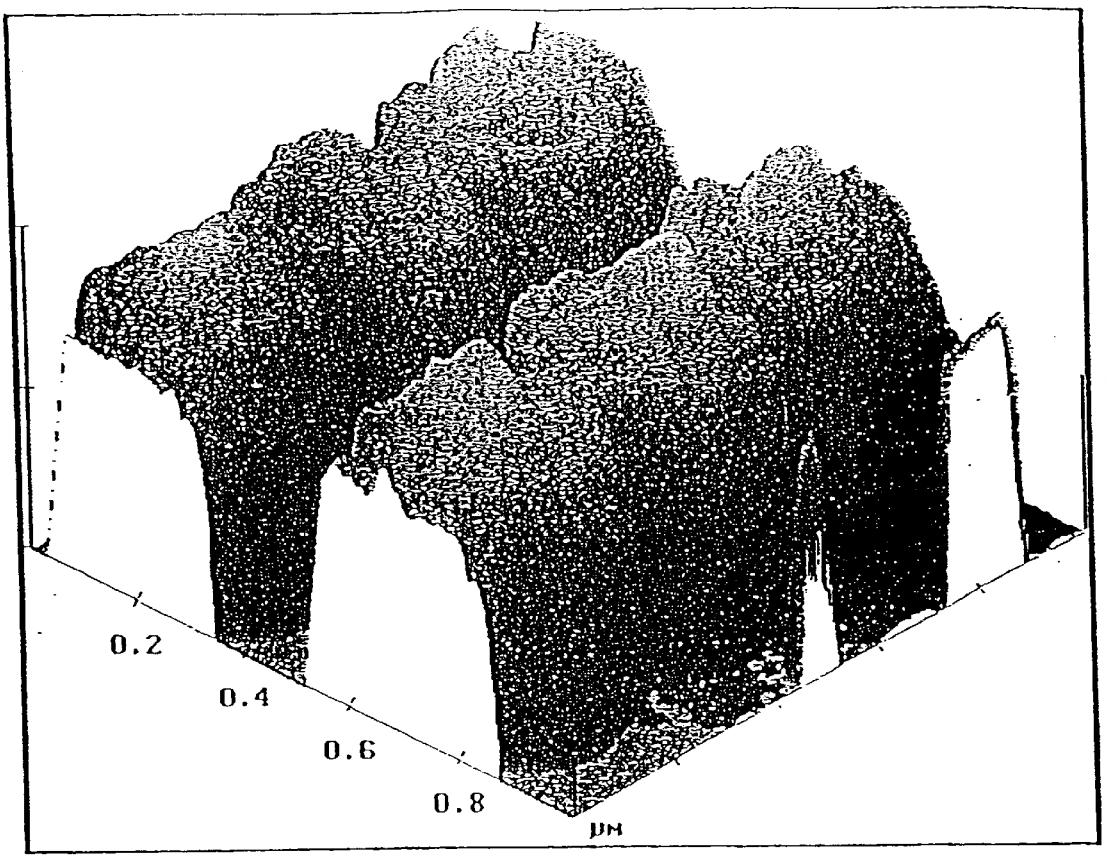
FIG. 13 is a three-dimensional plot of the capacitor structure of Example 1.

The BPSG layer surrounding the cavities is then etched back from around the cavity in a 10:1 HF dip and the resulting structure is depicted in FIG. 13, where it can be seen that the hemispherical grain silicon extends above the outer layer of polysilicon for each of the cavities.

Example 2

Structures were manufactured according to Example 1, with the exception that, after decapping, the edges of the doped polysilicon 132 and the undoped HSG silicon 134 were etched with a 2.25% TMAH solution (by weight) at 30 degrees Celsius.

Figure 14:
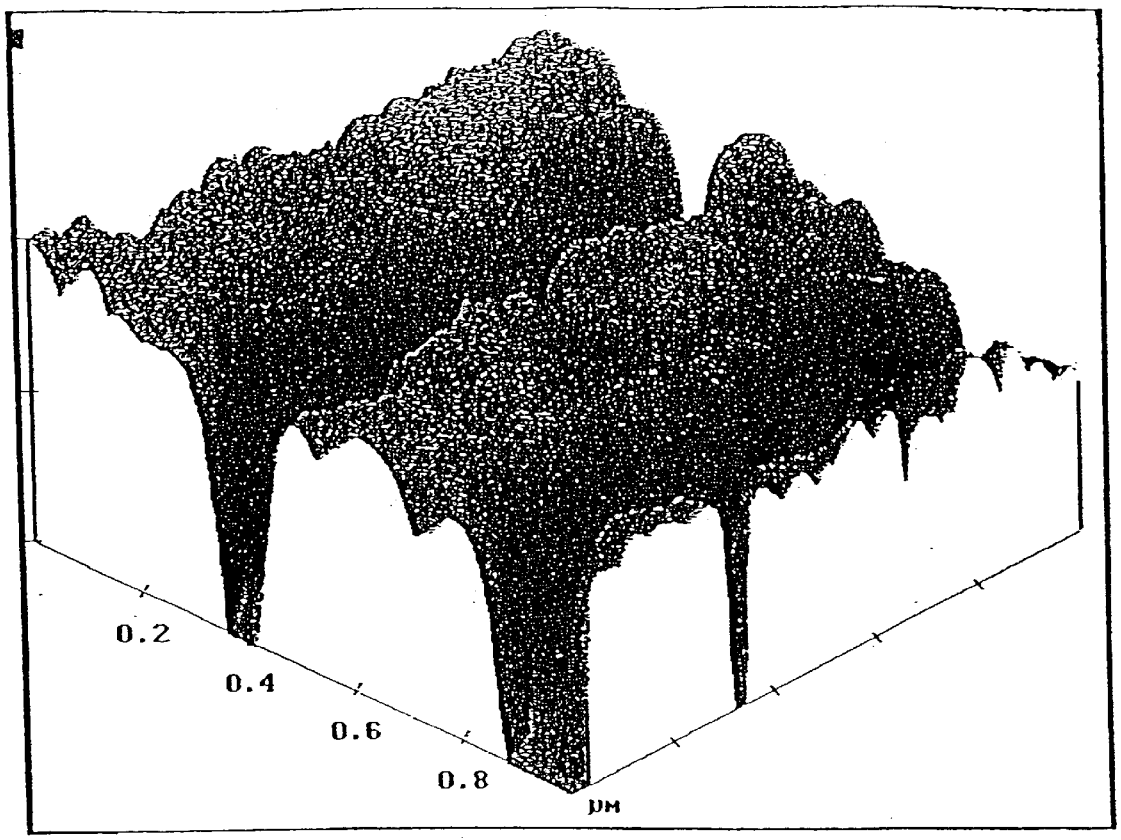
FIG. 14 is a three-dimensional plot of the capacitor structure of Example 2.

The resulting structures are depicted in FIG. 14 after etch-back of the BPSG surrounding the cavities. It can be seen that the height of the hemispherical grain silicon relative is reduced relative to the outer layer of doped polysilicon.

Example 3

Structures were manufactured according to Example 1, with the exception that, after decapping, the edges of the doped polysilicon 132 and the undoped hemispherical grain silicon 34 were etched with a 2.6% TMAH solution (by weight) at 30 degrees Celsius.

Figure 15:
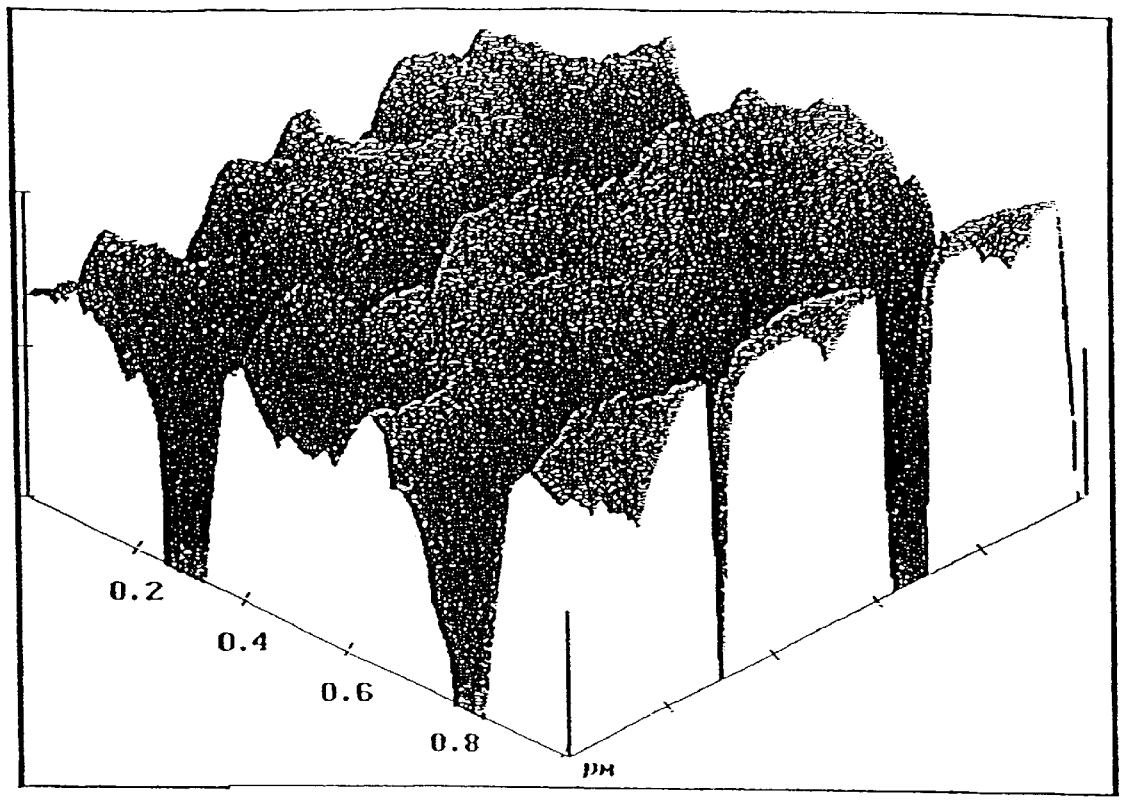
FIG. 15 is a three-dimensional plot of the capacitor structure of Example 3.

The resulting structures are depicted in FIG. 15 after etch-back of the BPSG layer. It can be seen that the hemispherical grain silicon layer is recessed within the container structure formed by the outer layer of doped polysilicon.

All patents, patent documents and other references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the recessed hemispherical grain silicon layers as described herein. Various modifications of the illustrative embodiments, as well as additional embodiments of the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method of forming a capacitor structure comprising:

providing a cavity in a substrate, the cavity comprising a sidewall structure, an opening, and a bottom opposite the opening of the cavity;

providing a first layer on an inner surface of the sidewall structure, wherein the first layer is electrically conductive;

providing a second layer on substantially all of the first layer, the second layer comprising hemispherical grain silicon precursor;

providing fill material in the cavity, wherein at least an edge of the second layer is exposed proximate the opening of the cavity;

removing the hemispherical grain silicon precursor in the second layer proximate the opening of the cavity to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

2. A method according to claim 1, wherein removing the hemispherical grain silicon precursor in the second layer comprises selectively etching the second layer relative to the first layer in an etch process with a selectivity for etching the hemispherical grain silicon precursor in the second layer over the first layer of at least about 2:1.

3. A method according to claim 1, wherein removing the hemispherical grain silicon precursor in the second layer comprises selectively etching the second layer relative to the first layer in an etch process with a selectivity for etching the hemispherical grain silicon precursor in the second layer over the first layer of at least about 4:1.

4. A method according to claim 1, wherein the cavity is cup-shaped.

5. A method of forming a capacitor structure comprising:

providing a cavity in a substrate, the cavity comprising a sidewall structure, an opening, and a bottom opposite the opening of the cavity;

providing a first layer on an inner surface of the sidewall structure, wherein the first layer comprises doped silicon;

providing a second layer on substantially all of the first layer, the second layer comprising hemispherical grain silicon precursor;

providing fill material in the cavity, wherein at least an edge of the second layer is exposed proximate the opening of the cavity;

removing the hemispherical grain silicon precursor in the second layer proximate the opening of the cavity to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

6. A method according to claim 5, wherein removing the hemispherical grain silicon precursor in the second layer comprises selectively etching the second layer relative to the first layer by contacting at least the exposed edge of the second layer with an etchant having a selectivity for etching the hemispherical grain silicon precursor in the second layer over the first layer of at least about 2:1.

7. A method according to claim 5, wherein removing the hemispherical grain silicon precursor in the second layer comprises selectively etching the second layer relative to the first layer by contacting at least the exposed edge of the second layer with an etchant having a selectivity for etching the hemispherical grain silicon precursor in the second layer over the first layer of at least about 4:1.

8. A method according to claim 5, wherein the cavity is cup-shaped.

9. A method of forming a capacitor structure comprising:

providing a cavity in a substrate, the cavity comprising a sidewall structure, an opening, and a bottom opposite the opening of the cavity;

providing a first layer on an inner surface of the sidewall structure, wherein the first layer comprises doped silicon;

providing a second layer on substantially all of the first layer, the second layer comprising hemispherical grain silicon precursor;

providing fill material in the cavity, wherein at least an edge of the second layer is exposed proximate the opening of the cavity;

removing the hemispherical grain silicon precursor in the second layer proximate the opening of the cavity by contacting at least the exposed edge of the second layer with an etchant comprising TMAH at a concentration of greater than 2.25% (by weight) to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

10. A method according to claim 9, wherein the etchant comprises TMAH at a concentration of about 2.5% (by weight) or greater.

11. A method according to claim 9, wherein the etching is performed at a temperature of about 30 degrees Celsius.

12. A method of forming a capacitor structure comprising:

providing a cavity in a substrate, the cavity comprising a sidewall structure, an opening, and a bottom opposite the opening of the cavity;

providing a first layer on an inner surface of the sidewall structure, wherein the first layer comprises doped silicon;

providing a second layer on substantially all of the first layer, the second layer comprising hemispherical grain silicon precursor;

providing fill material in the cavity, wherein at least an edge of the second layer is exposed proximate the opening of the cavity;

removing the hemispherical grain silicon precursor in the second layer proximate the opening of the cavity by contacting at least the exposed edge of the second layer with an etchant comprising TMAH at a concentration of greater than 2.25% (by weight) and less than 3% (by weight) to form an edge zone about the opening of the cavity, the edge zone extending from the opening of the cavity towards the bottom of the cavity; and converting the hemispherical grain silicon precursor in the second layer to hemispherical grain silicon, wherein the edge zone is substantially free of the hemispherical grain silicon.

13. A method according to claim 12, wherein the etching is performed at a temperature of about 30 degrees Celsius.

14. A method of forming a capacitor structure comprising:

providing a cavity in a substrate, the cavity comprising a sidewall structure, an opening, and a bottom opposite the opening of the cavity;

providing a first layer on an inner surface of the sidewall structure, wherein the first layer is electrically conductive;

providing a second layer on substantially all of the first layer, the second layer comprising hemispherical grain silicon;

providing fill material in the cavity, wherein at least an edge of the second layer is exposed proximate the opening of the cavity; and removing the hemispherical grain silicon in the second layer proximate the opening of the cavity to form an edge zone about the opening of the cavity, the edge zone extending from the opening of the cavity towards the bottom of the cavity, wherein the edge zone is substantially free of the hemispherical grain silicon.

15. A method according to claim 14, wherein removing the hemispherical grain silicon in the second layer comprises selectively etching the second layer relative to the first layer in an etch process with a selectivity for etching the hemispherical grain silicon in the second layer over the first layer of at least about 2:1.

16. A method according to claim 14, wherein removing the hemispherical grain silicon in the second layer comprises selectively etching the second layer relative to the first layer in an etch process with a selectivity for etching the hemispherical grain silicon in the second layer over the first layer of at least about 4:1.

17. A method according to claim 14, wherein the cavity is cup-shaped.

18. A method of forming a capacitor structure comprising:

providing a cavity in a substrate, the cavity comprising a sidewall structure, an opening, and a bottom opposite the opening of the cavity;

providing a first layer on an inner surface of the sidewall structure, wherein the first layer comprises doped silicon;

providing a second layer on substantially all of the first layer, the second layer comprising hemispherical grain silicon;

providing fill material in the cavity, wherein at least an edge of the second layer is exposed proximate the opening of the cavity; and removing the hemispherical grain silicon in the second layer proximate the opening of the cavity to form an edge zone about the opening of the cavity, the edge zone extending from the opening of the cavity towards the bottom of the cavity, wherein the edge zone is substantially free of the hemispherical grain silicon.

19. A method according to claim 18, wherein removing the hemispherical grain silicon in the second layer comprises selectively etching the second layer relative to the first layer by contacting at least the exposed edge of the second layer with an etchant having a selectivity for etching the hemispherical grain silicon in the second layer over the first layer of at least about 2:1.

20. A method according to claim 18, wherein removing the hemispherical grain silicon in the second layer comprises selectively etching the second layer relative to the first layer by contacting at least the exposed edge of the second layer with an etchant having a selectivity for etching the hemispherical grain silicon in the second layer over the first layer of at least about 4:1.

21. A method according to claim 18, wherein the cavity is cup-shaped.

22. A method of forming a capacitor structure comprising:

providing a cavity in a substrate, the cavity comprising a sidewall structure, an opening, and a bottom opposite the opening of the cavity;

providing a first layer on an inner surface of the sidewall structure, wherein the first layer comprises doped silicon;

providing a second layer on substantially all of the first layer, the second layer comprising hemispherical grain silicon;

providing fill material in the cavity, wherein at least an edge of the second layer is exposed proximate the opening of the cavity; and removing the hemispherical grain silicon of the second layer proximate the opening of the cavity by contacting at least the exposed edge of the second layer with an etchant comprising TMAH at a concentration of greater than 2.25% (by weight) to form an edge zone about the opening of the cavity, the edge zone extending from the opening of the cavity towards the bottom of the cavity, wherein the edge zone is substantially free of the hemispherical grain silicon.

23. A method according to claim 22, wherein the etchant comprises TMAH at a concentration of about 2.5% (by weight) or greater.

24. A method according to claim 22, wherein the etching is performed at a temperature of about 30 degrees Celsius.

25. A method of forming a capacitor structure comprising:

providing a cavity in a substrate, the cavity comprising a sidewall structure, an opening, and a bottom opposite the opening of the cavity;

a first layer on an inner surface of the sidewall structure, wherein the first layer comprises doped silicon;

providing a second layer on substantially all of the first layer, the second layer comprising hemispherical grain silicon;

providing fill material in the cavity, wherein at least an edge of the second layer is exposed proximate the opening of the cavity; and removing the hemispherical grain silicon in the second layer proximate the opening of the cavity by contacting at least the exposed edge of the second layer with an etchant comprising TMAH at a concentration of greater than 2.25% (by weight) and less than 3% (by weight) to form an edge zone about the opening of the cavity, the edge zone extending from the opening of the cavity towards the bottom of the cavity, wherein the edge zone is substantially free of the hemispherical grain silicon.

26. A method according to claim 25, wherein the etching is performed at a temperature of about 30 degrees Celsius.

* * * * *